United States Patent [19]
Belmont et al.

[11] Patent Number: 4,717,641
[45] Date of Patent: Jan. 5, 1988

[54] METHOD FOR PASSIVATING A SEMICONDUCTOR JUNCTION

[75] Inventors: Emanuel Belmont; Henry G. Hughes, both of Scottsdale, Ariz.

[73] Assignee: Motorola Inc., Schaumburg, Ill.

[21] Appl. No.: 819,320

[22] Filed: Jan. 16, 1986

[51] Int. Cl.⁴ ............................................. G03C 11/00
[52] U.S. Cl. .................................. 430/198; 430/311; 430/328; 430/330
[58] Field of Search ............... 430/198, 328, 329, 330, 430/311

[56] References Cited

U.S. PATENT DOCUMENTS

| | | | |
|---|---|---|---|
| 3,355,291 | 11/1967 | Baird et al. | 430/198 |
| 3,632,434 | 1/1972 | Hutson | 427/93 |
| 3,982,941 | 9/1976 | Inskip | 430/198 |
| 4,201,579 | 5/1980 | Robinson et al. | 430/323 |
| 4,332,879 | 6/1982 | Pastor et al. | 430/272 |
| 4,551,353 | 11/1985 | Hower et al. | 427/39 |

*Primary Examiner*—John E. Kittle
*Assistant Examiner*—José G. Dees
*Attorney, Agent, or Firm*—Joe E. Barbee

[57] ABSTRACT

A method of passivating exposed junctions on a semiconductor device is provided by the use of fritted glass and a rapid heating device. The uniform distribution of heat from the rapid heating device is used to fire the fritted glass that is covering the exposed junction. The results of this combination is an increase in device yields due to less leakage across the junction.

4 Claims, 1 Drawing Figure

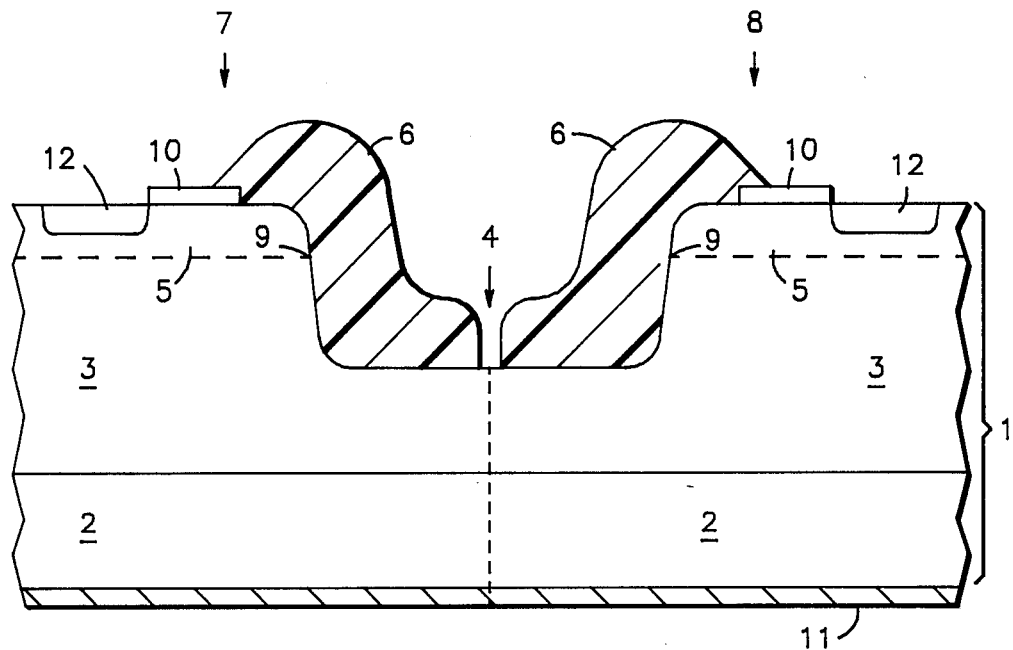

METHOD FOR PASSIVATING A SEMICONDUCTOR JUNCTION

BACKGROUND OF THE INVENTION

This invention relates, in general, to semiconductor devices, and more particularly, to a method of fabricating a semiconductor device in which the active junction is covered with a fritted glass layer that is fired by a rapid heating apparatus.

Surface passivation using glass powder or fritted glass is effective for achieving good reliability in high voltage silicon power devices since glass is electrically stable, easy to coat as a thick film, and is resistant to humidity. Therefore, many glass passivated silicon devices, such as thyristors, transistors, and diodes, have been developed.

Glasses as passivants for silicon devices are classified roughly into zinc-based glass and lead-based glass. The procedure for mixing these types of glasses with photoresist is described in the following references. In U.S. Pat. No. 3,355,291 entitled "Application Of Glass To Semiconductor Devices", borosilicate glass is mixed with a photoresist polymer. U.S. Pat. No. 3,632,434 entitled "Process For Glass Passivating Silicon Semiconductor Junctions", describes a method for mixing a lead oxide compound and a liquid organic.

Mixing the fritted glass and photoresist results in a slurry that can be deposited on a semiconductor substrate or device by a spin coater. The glass coated device is soft baked in a oven before being patterned by standard photolithography techniques. Next, the device is placed in an oxygen plasma to burn off the photoresist which leaves only the patterned fritted glass over the device. To actually fuse the glass together, the device is slowly pushed into a firing furnace.

Unfortunately, it was discovered that the firing furnace did not have good temperature uniformity from substrate to substrate or within a substrate. The firing furnace required about 15 minutes for temperature equilibrium after the substrates were inserted. The zone at the mouth of the furance recovered more slowly than the other zones, so that there is a longitudinal temperature gradient. Reducing the gradient by increasing firing time caused degradation due to overfiring. Overfiring will cause soft, low breakdown voltage and high leakage at 150 degrees Celsius. Underfiring of the glass will give an incomplete seal leading to low breakdown and high collector-base leakage.

To appreciate the seriousness of the uniformity problem, one must realize that there are approximately 45 three inch wafers or substrates or approximately 25 five inch wafers loaded into a firing furnace at one time. On each three inch wafer there may be as many as 1,150 dice or as many as 4,600 dice on a single five inch wafer. Underfiring would occur at the load end of the furance where the temperature would not be high enough to completely fuse the glass. Overfiring would occur in the source end of the furnace where the temperature would be too high. Hundreds to thousands of dice would be rejected due to improper firing of the fritted glass.

SUMMARY OF THE INVENTION

Accordingly, it is an object of the present invention to provide a method for improving the yield in the manufacturing of a semiconductor device.

Another object of this invention is to decrease or eliminate rejected devices due to improper device characteristics.

An additional object is to fire fritted glass in a uniform and reproducible manner.

The foregoing and other objects and advantages are achieved in the present invention which, as part thereof, comprises forming a semiconductor device with exposed junctions, covering the exposed junctions with a fritted glass, and firing the fritted glass with a rapid heating apparatus.

BRIEF DESCRIPTION OF THE DRAWINGS

The single FIGURE is an enlarged sectional view illustrating a high voltage power transistor fabricated in accordance with the present invention.

DETAILED DESCRIPTION OF THE INVENTION

The sectional view of the single FIGURE represents a high voltage power transistor fabricated in accordance with the present invention. Substrate 1 is divided in N+ collector 2, N− collector 3, and P-type base 5. Diffused into base 5 is emitter 12. Covering exposed junction 9 is passivation glass 6. Region 10 is silicon dioxide. On the backside of substrate 1 is metal contact 11. Transistor 7 is a mirror image of transistor 8 and is separated from each other by scribe grid 4. Transistors 7 and 8 are just two of many devices that are found on substrate 1.

In this example, glass 6 is a mixture comprised of approximately 50 percent by weight lead oxide, 40 percent by weight silicon dioxide, and 10 percent by weight aluminum oxide. These components are mixed with a photoresist, such as Waycoat SC450 resist, to form a slurry that is spun on to a substrate from a spin coater. The glass coated device is placed in a oven for approximately 45 minutes at a temperature of approximately 80 degrees Celsius. This step is sometimes referred to as a soft bake. After the soft bake, the glass layer is patterned by standard photolithography techniques. Since the slurry is part photoresist, the slurry itself is patterned without an additional photoresist step. Next, the device is placed in an oxygen plasma for 60 to 90 minutes to burn off the the majority of photoresist which leaves the patterned fritted glass over the device.

Prior to firing, the device is placed in a furnace for about 15 minutes at a temperature of approximately 800 degrees Celsius. This is to insure that the rapid heating apparatus (R.H.A.) does not become contaminated with any residual photoresist thay may have been left on the device. To fuse the glass components together, the glass is fired by placing the device in the rapid heating apparatus such as an A.G. Associates Heatpulse, Model 2101. The Heatpulse utilizes a single robot arm, which takes wafers from a load cassette and places them in a process chamber. The wafer is placed on quartz pins which are designed to minimize conduction of heat from the wafer. The heating in this case is by a row of tungsten-halogen lamps above and below the wafer. The wafer is isolated from the lamps by a quartz tube. This tube can be purged and subsequently filled with different process gases depending on the process. Other rapid heating apparatuses that are available incude Varian/Extrion IA-200 and the ROA by Eaton.

Substrate 1 having transistors 7 and 8, is rapidly heated for a time period in the range of 30 to 120 seconds, preferable for 60 seconds, and at a temperature in the range of 900 to 1000 degrees Celsius, preferable for 925 degrees Celsius. The firing burns off any volatile impurities remaining in the glass and fuses the glass particles to each other and to the substrate. To relieve the stress caused by the firing, the device is placed in an anneal furnace for approximately 30 minutes. The anneal furnace is at a temperature of about 630 degrees Celsius. After the 30 minutes, the temperature is lowered to 570 degrees at a rate of 2 degrees per minute.

A major advantage in using a rapid heating apparatus in the present invention is its uniform heating and cooling. It was found that by using the R.H.A. to fire fritted glass, that the yields of the deivce were dramatically improved as the uniformity of the firing temperature was improved. An additional advantage to the above process is noted in the fact that the firing temperature is consistent and uniform, which allows for easier troubleshooting of process related problems.

Thus, it is apparent that there has been provided an improved method for firing a fritted glass when used to cover an exposed junction of a semiconductor device. This is accomplished in part with the use of a rapid heating apparatus and a device formed on a wafer or substrate.

We claim:

1. A method for fabricating a semiconductor device with exposed junctions, comprising:
    forming a slurry from a mixture of powdered glass and photoresist;
    coating the semiconductor device with a layer of the slurry;
    soft baking the device in an oven;
    forming a pattern in the slurry layer by exposure and development;
    removing the photoresist from the slurry pattern using an oxygen plasma;
    fusing the glass by firing the device in a rapid heating apparatus; and
    annealing the device to remove stress in the glass.

2. The method as defined in claim 1, in which the temperature of the rapid heating apparatus is in the range of 900 to 1000 degrees Celsius for a time period of 30 to 120 seconds.

3. The method as defined in claim 1 including the step of placing the device in an 800 degree Celsius furnace for approximately 15 minutes, prior to the step of fusing the glass.

4. A method for fabricating a semiconductor device with exposed junctions, comprising: forming a slurry from a mixture of powdered glass and photoresist, coating the semiconductor device with a layer of the slurry; soft baking the device in an oven; forming a pattern in the slurry layer by exposure and development; removing the photoresist from the slurry pattern using an oxygen plasma; fusing the glass by firing the device in a rapid heating apparatus; and annealing the device to remove stress in the glass, wherein the temperature of the annealing step is 630 degrees Celsius for approximately 30 minutes, and then the temperature is lowered to 570 degrees at a rate of 2 degrees per minute.

* * * * *